United States Patent
Yun et al.

(10) Patent No.: US 10,591,543 B2
(45) Date of Patent: Mar. 17, 2020

(54) TEST APPARATUS FOR SEMICONDUCTOR DEVICE AND METHOD OF MANUFACTURING SEMICONDUCTOR DEVICE

(71) Applicant: Samsung Electronics Co., Ltd., Suwon-si, Gyeonggi-do (KR)

(72) Inventors: Joo-sung Yun, Asan-si (KR); Soon-il Kwon, Asan-si (KR); Byeong-min Yu, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/410,164

(22) Filed: May 13, 2019

(65) Prior Publication Data

US 2019/0377028 A1    Dec. 12, 2019

(30) Foreign Application Priority Data

Jun. 12, 2018  (KR) .................... 10-2018-0067526

(51) Int. Cl.
  *G01R 31/3185*  (2006.01)
  *H03K 19/1776*  (2020.01)
  *H03K 19/17704*  (2020.01)

(52) U.S. Cl.
  CPC . *G01R 31/318519* (2013.01); *H03K 19/1776* (2013.01); *H03K 19/17704* (2013.01)

(58) Field of Classification Search
  CPC .... G01R 31/28; G01R 31/2851; G01R 31/30; G01R 31/3181; G01R 31/3185;

(Continued)

(56) References Cited

U.S. PATENT DOCUMENTS 5,914,906 A    6/1999  Iadanza et al.
6,874,107 B2 *  3/2005  Lesea ............... G01R 31/31701
                                                326/41

(Continued)

FOREIGN PATENT DOCUMENTS

JP    2012-019400 A    1/2012
KR   10-1997-0055535   5/1999

(Continued)

*Primary Examiner* — Jason Crawford
(74) *Attorney, Agent, or Firm* — Harness, Dickey & Pierce, P.L.C.

(57) ABSTRACT

Provided are a test board and a test system for efficiently testing a semiconductor package, and a manufacturing method for the semiconductor package using the same. A test apparatus includes a field programmable gate array (FPGA) configured to output a first data signal to be transmitted to the semiconductor device and a second data signal to be transmitted to the semiconductor device and a memory configured to store a test result. The FPGA includes a first input/output block configured to output the first data signal, a second input/output block configured to output the second data signal, a serializer/deserializer (SerDes) circuit configured to generate a strobe signal, and a skew calibration input/output block configured to receive the first data signal from the first input/output block, the second data signal from the second input/output block, and the strobe signal from the SerDes circuit.

20 Claims, 7 Drawing Sheets

(58) Field of Classification Search
CPC .... G01R 31/318516; G01R 31/318519; H03K 19/17704; H03K 19/1776; G06F 11/00; G11C 29/00
See application file for complete search history.

(56) References Cited

U.S. PATENT DOCUMENTS

| | | | |
|---|---|---|---|
| 7,600,162 B2 | 10/2009 | Nishizawa | |
| 7,769,558 B2 | 8/2010 | Kappauf et al. | |
| 2011/0099407 A1* | 4/2011 | Jonas ............... | H03K 19/17744 713/400 |
| 2018/0350445 A1* | 12/2018 | Linnen ............... | G11C 29/1201 |

FOREIGN PATENT DOCUMENTS

| | | |
|---|---|---|
| KR | 10-2010-0121217 A | 11/2010 |
| KR | 10-2010-0136139 A | 12/2010 |
| KR | 10-1039845 B1 | 6/2011 |
| KR | 10-2012-0105765 A | 9/2012 |
| KR | 10-1309182 B1 | 9/2013 |
| KR | 10-1310404 B1 | 10/2013 |
| KR | 10-1315505 B1 | 10/2013 |
| KR | 10-1348425 B1 | 1/2014 |
| KR | 10-2014-0022167 A | 2/2014 |
| KR | 10-1364267 B1 | 2/2014 |

* cited by examiner

TEST APPARATUS FOR SEMICONDUCTOR DEVICE AND METHOD OF MANUFACTURING SEMICONDUCTOR DEVICE

CROSS-REFERENCE TO RELATED APPLICATION

This application claims the benefit of Korean Patent Application No. 10-2018-0067526, filed on Jun. 12, 2018, in the Korean Intellectual Property Office, the disclosure of which is incorporated herein in its entirety by reference.

BACKGROUND

Inventive concepts relates to a test apparatus for a semiconductor device and/or a method of manufacturing the semiconductor device, and more particularly, to a test apparatus for a semiconductor device under test (DUT) and/or a method of manufacturing a semiconductor device using the test apparatus.

Due to the rapid development of the electronics industry and rising user demand, electronic devices are becoming increasingly more compact, with a high performance and high capacity. As a result, testing of semiconductor devices in the electronic devices is also becoming more complicated. In order to shorten the time and improve the accuracy of testing, test facilities are getting bigger.

During testing, skew between received data signals may affect the stability of data signal transmission. Skew is caused by the difference in signal delays between data signal transmission paths. Consequently, there is a desire for methods and devices for calibrating skew between data signals.

SUMMARY

Inventive concepts provides a test apparatus capable of efficiently testing a semiconductor device. Inventive concepts also provides a method of manufacturing a semiconductor device, the method including an operation of efficiently performing a test on a semiconductor device.

According to some example embodiments of inventive concepts, there is provided a test apparatus for a semiconductor device, the test apparatus including a field programmable gate array (FPGA) configured to output a first data signal to be transmitted to the semiconductor device and a second data signal to be transmitted to the semiconductor device and a memory configured to store a test result. The FPGA includes a first input/output block configured to output the first data signal, a second input/output block configured to output the second data signal, a serializer/deserializer (SerDes) circuit configured to generate a strobe signal, and a skew calibration input/output block configured to receive the first data signal from the first input/output block, the second data signal from the second input/output block, and the strobe signal from the SerDes circuit.

According to another some example embodiments of inventive concepts, there is provided a test apparatus for a semiconductor device, the test apparatus includes a test controller configured to output a first data signal to be transmitted to the semiconductor device and a second data signal to be transmitted to the semiconductor device and a memory configured to store test results. The test controller includes a first input/output block configured to output a first data signal, a second input/output block configured to output a second data signal, a serializer/deserializer (SerDes) circuit configured to generate a strobe signal, and a skew calibration input/output block configured to receive the first data signal, the second data signal, and the strobe signal. A frequency of the strobe signal is greater than a frequency of the first data signal and a frequency of the second data signal.

According to some example embodiments of inventive concepts, there is provided a method of manufacturing a semiconductor device using a test apparatus that includes a field programmable gate array (FPGA), the method includes manufacturing the semiconductor device, and testing the semiconductor device. The testing includes outputting a first data signal and a second data signal to test the semiconductor device, the outputting a first data signal and a second data signal performed by a first input/output block and a second input/output block included in the FPGA, receiving the first data signal and the second data signal, the receiving the first data signal and the second data signal performed by a skew calibration input/output block included in the FPGA, receiving a strobe signal that is generated by a serializer/deserializer (SerDes) circuit, the receiving the strobe signal performed by a skew calibration input/output block, and sampling the first data signal and the second data signal based on the strobe signal, the sampling performed by the skew calibration input/output block.

BRIEF DESCRIPTION OF THE DRAWINGS

Embodiments of inventive concepts will be more clearly understood from the following detailed description taken in conjunction with the accompanying drawings in which.

DETAILED DESCRIPTION OF EXAMPLE EMBODIMENTS

When numerical values or equalities are used herein without any further modification, it is intended that the associated numerical values or equalities include a tolerance, e.g. an engineering tolerance, around the stated numerical value known to one of ordinary skill in the art. When ranges are specified, the range includes all values therebetween such as increments of 0.1%.

Figure 1:
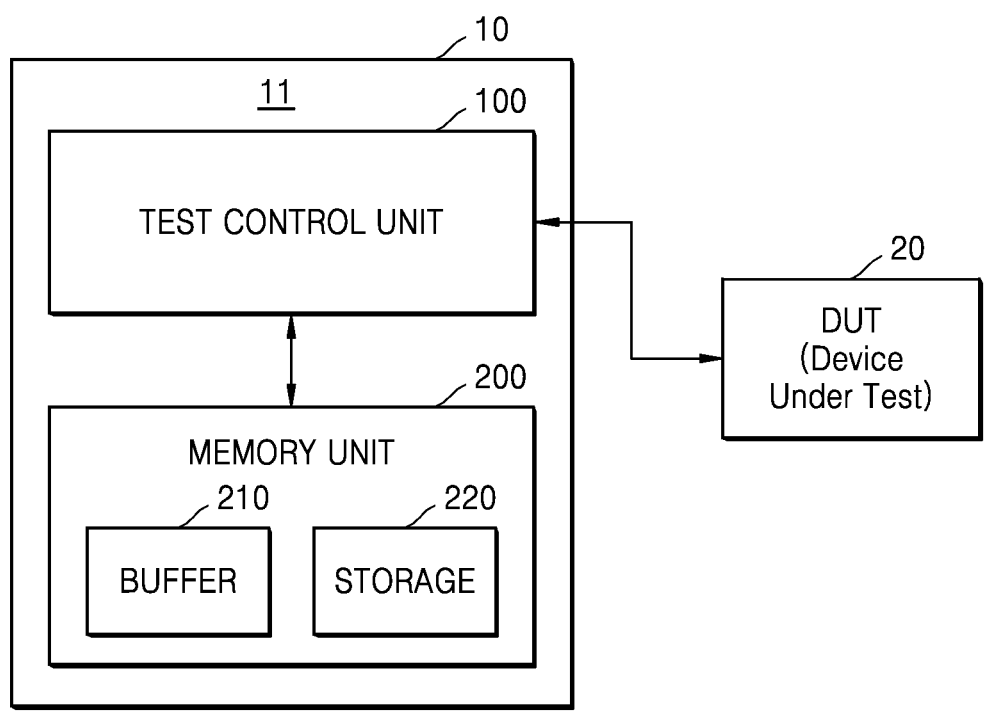
FIG. 1 is a block diagram of a test apparatus according to some example embodiments.

FIG. 1 shows a block diagram of a test apparatus according to some example embodiments.

Referring to FIG. 1, a test apparatus 10 for testing a semiconductor device may include a test controller 100 and a memory 200. In some example embodiments, at least a portion of the memory 200 may be included in the test controller 100.

In some example embodiments, the test controller 100 may be implemented by a single semiconductor chip such as a field programmable gate array (FPGA). For example, the test controller 100 may be implemented by using an FPGA from manufacturers such as Xilinx, Altera Lattice Semiconductor, Microsemi, Achronix, QuickLogic, e2v, and Atmel.

The test controller 100 may perform data processing and/or or interpreting and executing commands. For example, a test program executed in the test controller 100 may perform a functional test of inputting a data signal generated by an algorithm pattern generator e.g. an automatic test pattern generator (ATPG), to a device under test (DUT) 20, reading a signal output from the DUT 20, and comparing a read output signal with an expected pattern. When the output signal does not match the expected pattern with respect to the input signal, the test controller 100 may identify the DUT 20 as defective. For example, when the DUT 20 is or includes a semiconductor memory device such as dynamic random access memory (DRAM) or a NAND, the test program may write data generated by the algorithm pattern generator to the DUT 20 using a write operation, read the data from the DUT 20 using a read operation, and compare a read pattern with the expected pattern.

The test controller 100 may include a serializer/deserializer (SerDes) circuit therein and may use a strobe signal generated by the SerDes circuit to calibrate skew between the data signals output from the test controller 100 to the DUT 20.

The memory 200 may store test pattern commands, data read from the DUT 20, and a result of the test performed by the test controller 100. The memory 200 may include a buffer 210 and a storage 220. For example, the buffer 210 may include a volatile memory, while the storage 220 may include a non-volatile memory. In some example embodiments, the buffer 210 may be or include DRAM, while the storage 220 may be or include a flash memory, a solid state drive (SSD), and/or a hard disk drive (HDD).

The buffer 210 may temporarily store data read from the DUT 20 and the test result that are to be transmitted to the outside. The storage 220 may store the test pattern commands or the test results.

The test controller 100 may be attached to one surface of a board substrate 11. The memory 200 may also be attached to the surface of the board substrate 11. In some example embodiments, the test controller 100 and the memory 200 may be attached to the same surface of the board substrate 11.

The DUT 20 may be or include, for example, a system large scale integration (LSI), a flash memory, DRAM, static random access memory (SRAM), an electrically erasable programmable read-only memory (EEPROM), phase change random access memory (PRAM), magnetoresistive random access memory (MRAM), and/or resistive random access memory (RERAM).

The test apparatus 10 according to some example embodiments may generate a high-frequency data strobe signal using the SerDes circuit and may use the strobe signal to calibrate the skew between the data signals. Because a separate integrated circuit is not required to calibrate the skew between the data signals, a size of test equipment and a cost of manufacturing the test apparatus 10 may be reduced.

Figure 2:
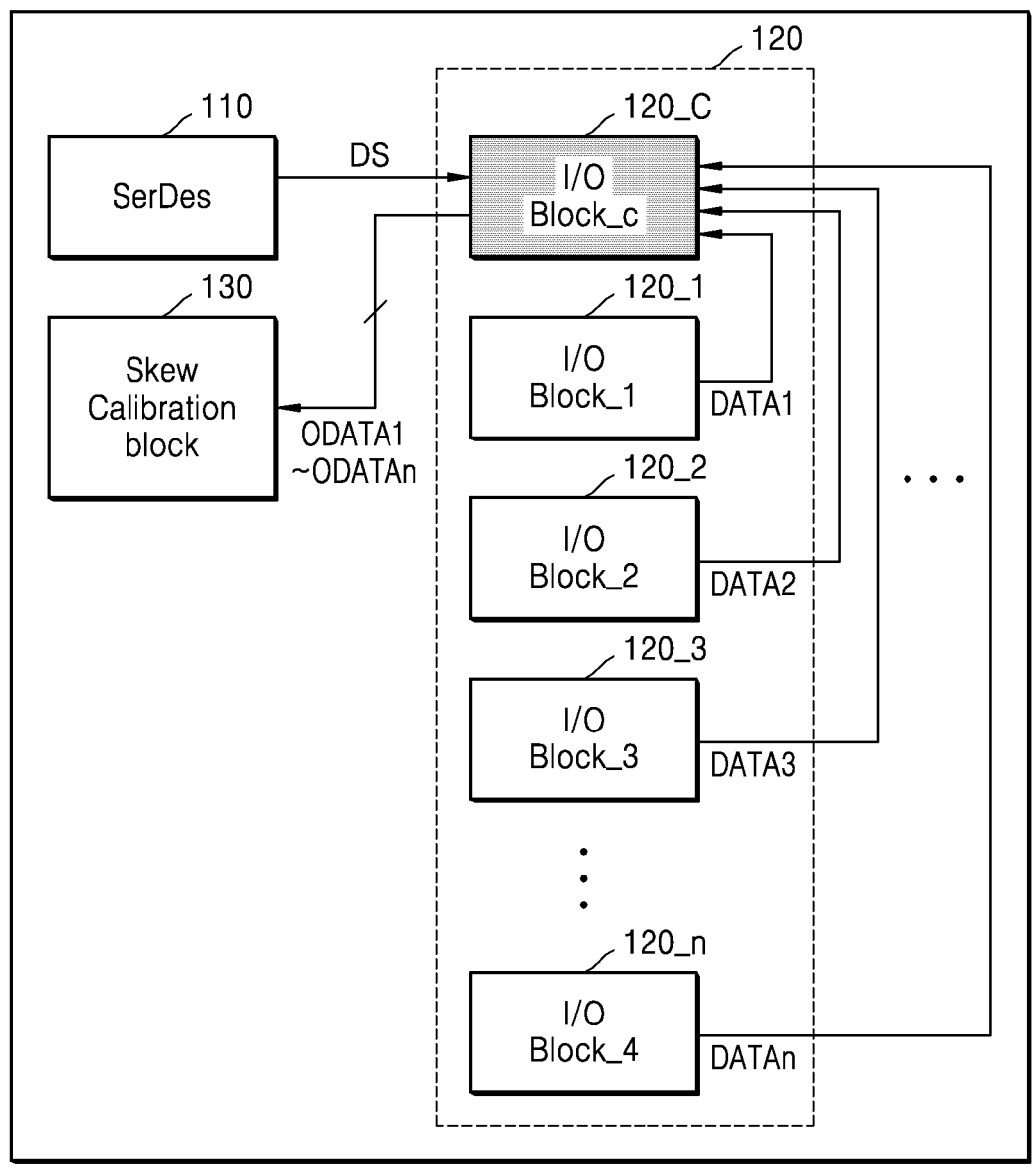
FIG. 2 is a block diagram of a test controller according to some example embodiments.

FIG. 2 shows a block diagram of an FPGA according to some example embodiments. FIG. 2 depicts some example embodiments of the test controller 100 of FIG. 1 implemented with an FPGA.

Referring to FIG. 2, the test controller 100 may include a SerDes circuit 110, a plurality of input/output blocks 120, and a skew calibration block 130.

In some example embodiments, at least a portion of the SerDes circuit 110 and the skew calibration block 130 may be implemented with functional blocks included in the test controller 100. The functional block may also be called intellectual property (IP) and may refer to units of blocks divided into unique functions that may be actually developed. At least a portion of the SerDes circuit 110 and the skew calibration block 130 may be separately programmed and stored in the test controller 100 to perform their respective functions in the test controller 100. The likes of an algorithm pattern generator and a comparator included in the test controller 100 to perform test operations of a DUT 20 may be implemented using functional blocks included in the test controller 100.

The SerDes circuit 110 may generate a strobe signal DS and may transmit the strobe signal DS to at least one of the plurality of input/output blocks 120 such as a skew calibration input/output block 120_c. In some example embodiments, an operating speed of the SerDes circuit 110 may be faster than the operating speeds of any of the plurality of input/output blocks 120. For example, the SerDes circuit 110 may operate at several GHz, while the plurality of input/output blocks 120 may each operate at several hundreds of MHz. The configuration of the SerDes circuit 110 will be described below with reference to FIG. 5.

The plurality of input/output blocks 120 may program the DUT 20 with logical values calculated by the algorithm pattern generator in the test controller 100, and/or receive data read from the DUT 20. Each of the plurality of input/output blocks 120 may include a plurality of input/output pins connected to the DUT 20. Signals may be input/output through the plurality of input/output pins.

At least some of the plurality of input/output blocks 120, for example, each of the first through nth input/output blocks 120_1 through 120_n, may send data signals to the DUT 20 in order for the test controller 100 to perform a test operation for the DUT 20. For example, the first input/output block 120_1 may output a first data signal DATA1, the second input/output block 120_2 may output a second data signal DATA2, and the nth input/output block may output an nth data signal DATAn. Referring to FIG. 2, n may be an integer of 4 or more.

Depending on the connection relationships between each of the first through nth input/output blocks 120_1 through 120_n and the internal functional blocks in the test controller 100, the output timing of the first through nth data signals DATA1 through DATAn from the first through nth input/output blocks 120_1 through 120_n may vary. The difference in the output timing of the first through nth data signals DATA1 through DATAn may be seen as an occurrence of skew. In some example embodiments, the further the physical distances between the internal functional blocks are, the more delayed the output timings of the first through nth data signals DATA1 through DATAn may be.

The plurality of input/output blocks 120 may include at least one skew calibration input/output block 120_c. The skew calibration input/output block 120_c may receive the first through nth data signals DATA1 through DATAn respectively from the first through nth input/output blocks 120_1 through 120_n and may receive the strobe signal DS from the SerDes circuit 110.

The skew calibration input/output block 120_c may include a plurality of synchronous circuits. In synchronism with the strobe signal DS, the plurality of synchronous circuits included in the skew calibration input/output block 120_c may transmit first through nth data output signals ODATA1 through ODATAn to the skew calibration block 130. The skew calibration input/output block 120_c will be described below with reference to FIG. 3.

The skew calibration block 130 calculates and calibrates a skew value in the first through nth data signals DATA1 through DATAn based on the readings of the first through nth data output signals ODATA1 through ODATAn. Therefore, the skew values may change depending on the levels of the strobe signal DS between the times when the first through nth data signals DATA1 through DATAn are respectively received.

FIG. 2 shows that the test controller 100 includes the skew calibration input/output block 120_c and the first through nth input/output blocks 120_1 through 120_n that are electrically connected to the skew calibration input/output block 120_c. However, a test apparatus according to some example embodiments is not limited thereto. The test controller 100 may include a plurality of skew calibration input/output blocks, and each of the skew calibration input/output blocks may be electrically connected to a plurality of input/output blocks. Each of the skew calibration input/output blocks may receive a plurality of data signals from the plurality of electrically connected input/output blocks.

The test apparatus according to some example embodiments does not include a separate integrated circuit outside the test controller 100 for skew calibration, but uses the SerDes circuit 110 included in the test controller 100 operating at high speed to generate the strobe signal DS. Therefore, a cost of manufacturing the test apparatus and a size of test equipment may be reduced.

Figure 3:
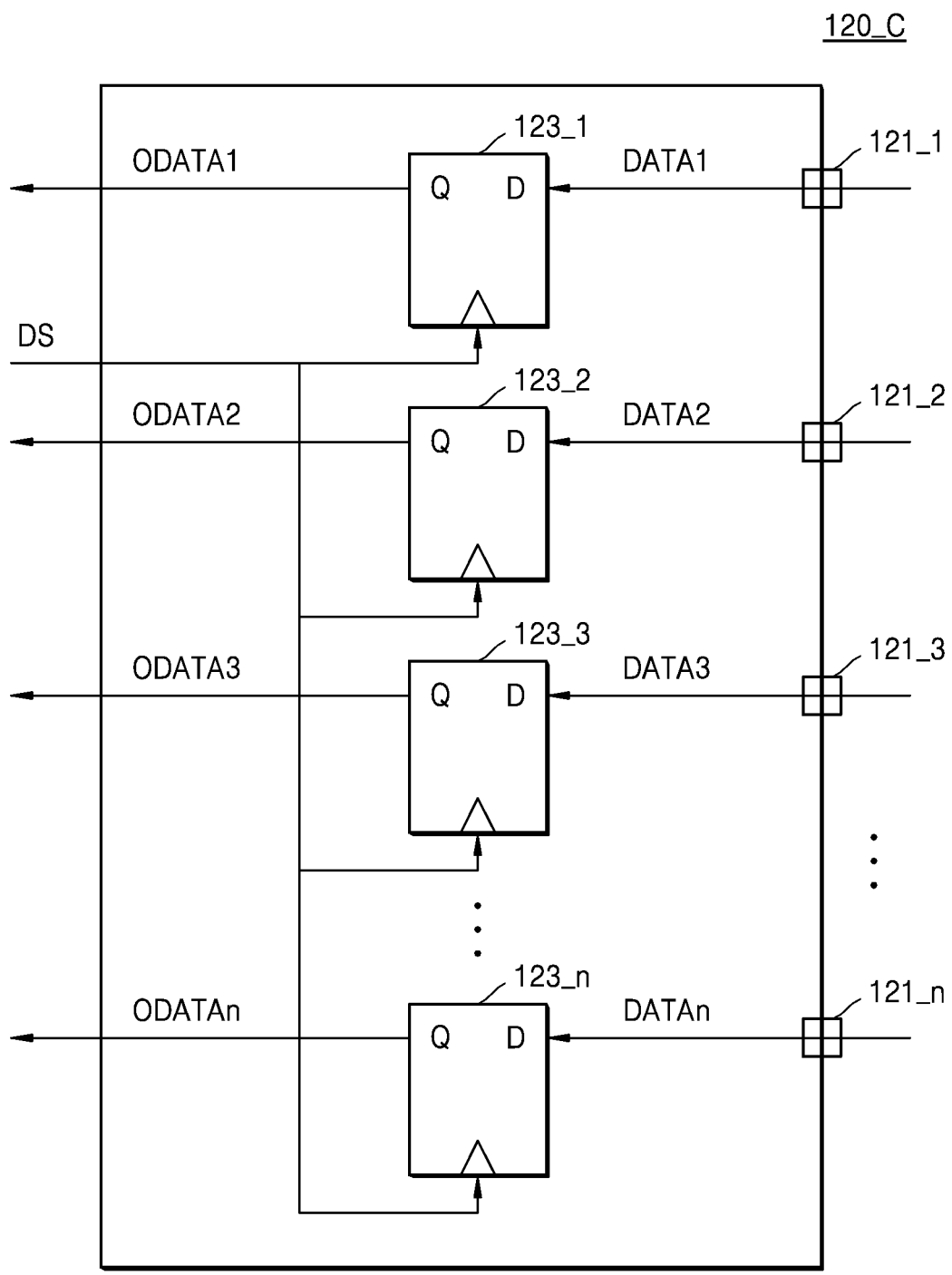
FIG. 3 is a block diagram of a skew calibration input/output block included in a test controller according to some example embodiments.
Figure 4:
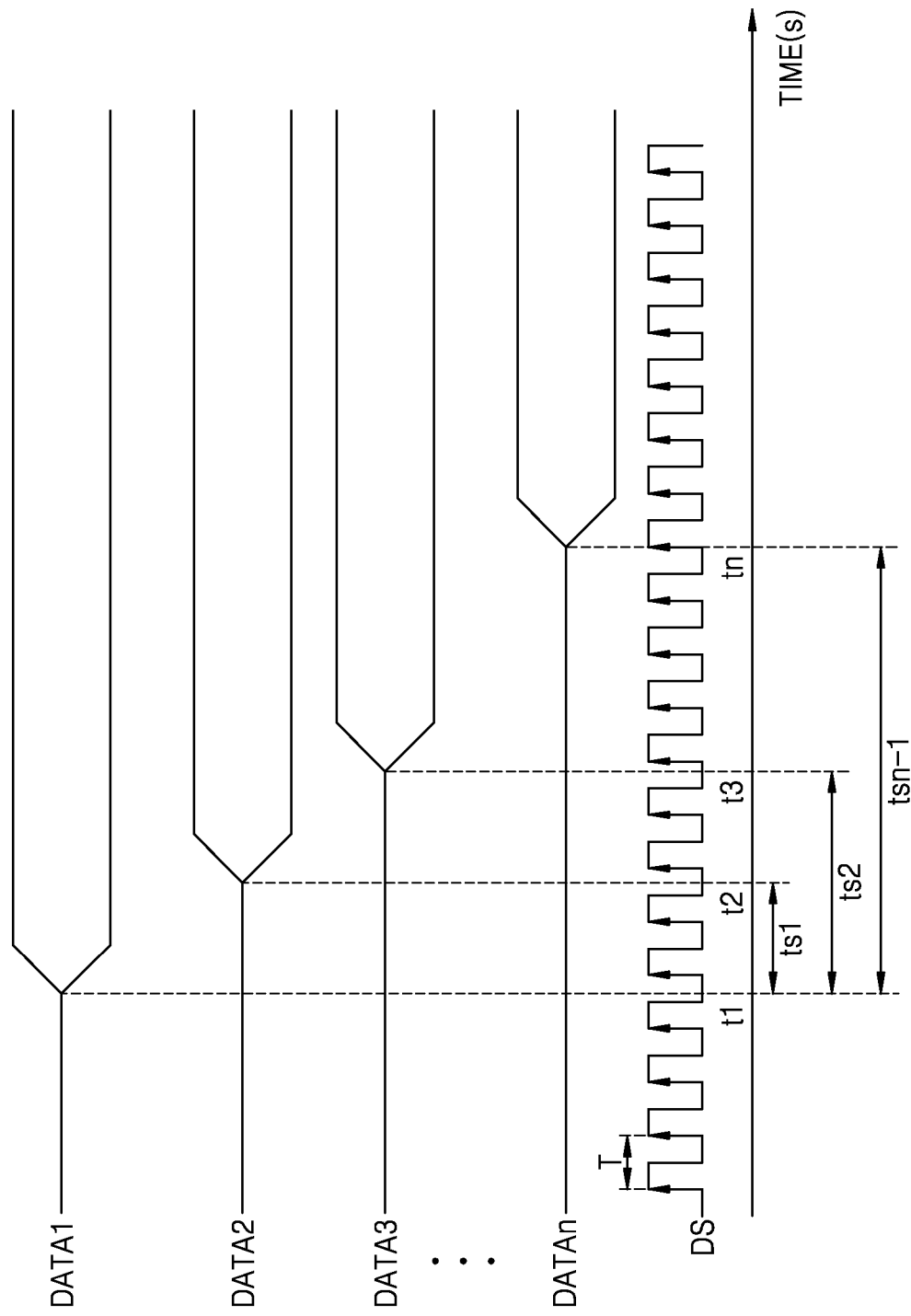
FIG. 4 is a timing diagram illustrating the operation of a skew calibration input/output block included in a test controller according to some example embodiments.

FIG. 3 shows a block diagram that shows a skew calibration input/output block included in a test controller according to some example embodiments. FIG. 4 shows a timing diagram illustrating the operation of the skew calibration input/output block included in the test controller according to some example embodiments. The test controller may be implemented with an FPGA.

Referring to FIG. 3, the skew calibration input/output block 120_c may include a plurality of synchronous circuits and a plurality of input pins. For example, the skew calibration input/output block 120_c may include first through nth input pins 121_1 through 121_n and first through nth synchronous circuits 123_1 through 123_n. The skew calibration input/output block 120_c may include more functions such as a buffer and the like.

The skew calibration input/output block 120_c may receive data signals via the first through nth input pins 121_1 through 121_n. For example, a first data signal DATA1 is received through the first input pin 121_1 and a second data signal DATA2 is received through the second input pin 121_2. The same explanation may be applied to the third through nth input pins 121_3 through 121_n.

Each of the first through nth synchronous circuits 123_1 through 123_n may include a first terminal D that receives input signals and a second terminal Q that transmits output signals. For example, the first synchronous circuit 123_1 may receive the first data signal DATA1, and in synchronism with a strobe signal DS, output a first data output signal ODATA1 based on the first data signal DATA1. Furthermore, the second synchronous circuit 123_2 may receive the second data signal DATA2, and in synchronism with the strobe signal DS, output a second data output signal ODATA2 based on the second data signal DATA2. The same description may be applied to the third through nth synchronous circuits 123_3 through 123_n.

According to some example embodiments, the first through nth synchronous circuits 123_1 through 123_n may each be a flip-flop circuit or a latch circuit.

Referring to FIGS. 3 and 4, the first through nth data signals DATA1 through DATAn input to the skew calibration input/output block 120_c are received by one of the first through nth input pins 121_1 through 121_n at different points in time t1 through tn. According to some example embodiments, the time for the data signals respectively from the first to nth input pins 121_1 through 121_n to be transmitted to the corresponding first through nth synchronous circuits 123_1 through 123_n may be substantially the same. Moreover, the time for the strobe signal DS input to the skew calibration input/output block 120_c to be transmitted to each of the first to nth synchronous circuits 123_1 through 123_n may also be substantially the same. For example, there may be no offset between the strobe signals DS reaching each of the first through nth synchronous circuits 123_1 through 123_n.

Because an operating speed of a SerDes circuit (e.g., 110 of FIG. 2) is faster than the operating speeds of each of the input/output blocks (e.g., 120 of FIG. 2) including the skew calibration input/output block 120_c, the frequency of the strobe signal DS transmitted by the SerDes circuit 110 may be greater than each of the frequencies of the first through nth data signals DATA1 through DATAn. Therefore, when the first through nth data signals DATA1 through DATAn are sampled by the strobe signal DS, a skew between the first through nth data signals DATA1 through DATAn may be detected.

According to some example embodiments, each of the first through nth synchronous circuits 123_1 through 123_n may be or include flip-flop circuits, and the first through nth data signals DATA1 through DATAn may be set (or, alternatively, predetermined) to synchronize with the rising edge of the strobe signal DS. However, inventive concepts are not limited thereto. The first to nth data signals DATA1 through DATAn may be set (or, alternatively, predetermined) to synchronize with the falling edge of the strobe signal DS, or the first to nth synchronous circuits 123_1 through 123_n may be or include latch circuits.

The first through nth synchronous circuits 123_1 through 123_n may sample the first through nth data signals DATA1 through DATAn based on the strobe signal DS. For example, the first synchronous circuit 123_1 may synchronize with the rising edge of the strobe signal DS after a first time t1 has elapsed, then output the first data output signal ODATA1 based on the first data signal DATA1. The second synchronous circuit 123_2 may synchronize with the strobe signal DS after a second time t2 has elapsed, then output the second data output signal ODATA2 based on the second data signal DATA2. Therefore, the skew calibration block (i.e. 130 in FIG. 2) may calculate a first skew ts1 between the first data signal DATA1 and the second data signal DATA2 based on a cycle T of the first data output signal ODATA1, the second data output signal ODATA2, and the strobe signal DS. For example, because the rising edge of the strobe signal DS is formed twice between the first time t1 and the second time t2 as illustrated in the non-limiting example embodiment of FIG. 4, the first skew ts1 may be calculated to be twice the cycle T of the strobe signal DS.

A second skew ts2 between the first data signal DATA1 and the third data signal DATA3 may be calculated based on the number of times the strobe signal DS forms rising edges (e.g., 4 times in FIG. 4) between the first time t1 when the first data signal DATA1 is received and a third time t3 when the third data signal DATA3 is received. An n–1th skew tsn−1 between the first data signal DATA1 and the nth data signal DATAn may be calculated differently based on the number of times the strobe signal DS forms rising edges between the first time t1 when the first data signal DATA1 is received and an nth time tn when the nth data signal DATAn is received. In other words, a skew value may be determined based on changes in a number of cycles of the strobe signal DS between the times when the first through nth data output signals ODATA1 through ODATAn are received.

Figure 5:
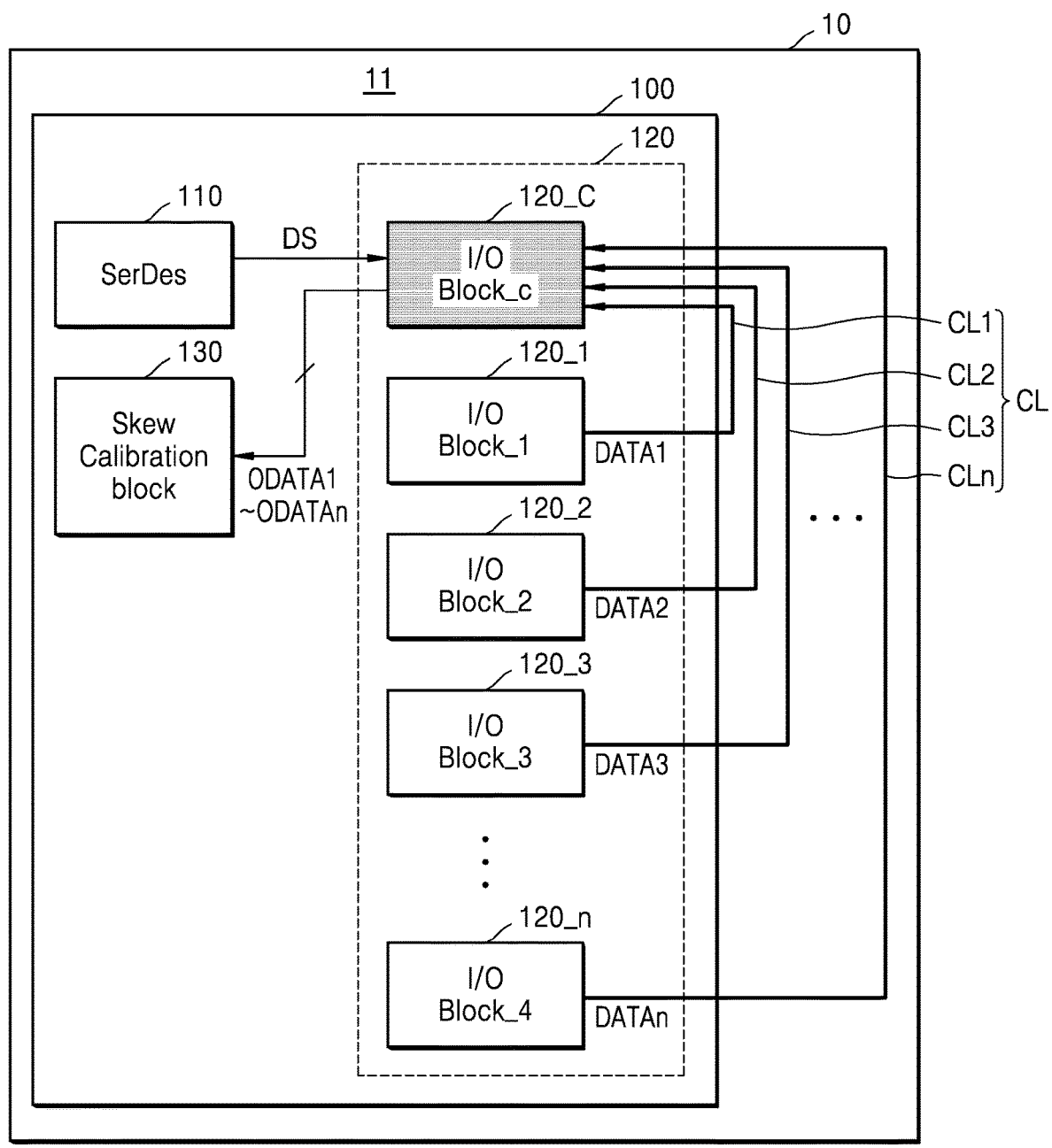
FIG. 5 is a block diagram of a test controller according to some example embodiments.

FIG. 5 shows a block diagram of an FPGA according to some example embodiments. FIG. 5 shows some example embodiments in which the test controller 100 of FIG. 1 is implemented using the FPGA.

Referring to FIG. 5, a test apparatus 10 for testing a semiconductor device may include an test controller 100 attached to a surface of a board substrate 11. The test controller 100 may include a SerDes circuit 110, a plurality of input/output blocks 120, and a skew calibration block 130. The test apparatus 10 may include a data line CL that electrically connects first through nth input/output blocks 120_1 through 120_n of the test controller 100 to a skew calibration input/output block 120_c. In this case, at least a portion of the data line CL may be formed on the board substrate 11 outside the test controller 100.

While the test controller 100 performs a test operation of the DUT 20, each of the first through nth input/output blocks 120_1 through 120_n may output data signals. The first through nth data signals DATA1 through DATAn from the first through nth input/output blocks 120_1 through 120_n may be transmitted to the skew calibration input/output block 120_c through the data line CL. For example, the first data signal DATA1 is transferred from the first input/output block 120_1 to the skew calibration input/output block 120_c through a first data line CL1, and the second data signal DATA2 is transferred from the second input/output block 120_2 to the skew calibration input/output block 120_c through a second data line CL2. The third data signal DATA3 is transferred from the third input/output block 120_3 to the skew calibration input/output block 120_c through a third data line CL3, and the nth data signal DATAn is transferred from the nth input/output block 120_n to the skew calibration input/output block 120_c through an nth data line CLn.

According to some example embodiments, the first through nth data lines CL1 through CLn that are included in the data line CL may have substantially the same physical lengths to each other. The time for the first through nth data signals DATA1 through DATAn from the first through nth input/output blocks 120_1 through 120_n to reach the skew calibration input/output block 120_c may be substantially identical to each other. The delay times from when the first through nth data signals DATA1 through DATAn from the first through nth input/output blocks 120_1 through 120_n are output until the first through nth data signals DATA1 through DATAn reach the skew calibration input/output block 120_c may be substantially identical to each other. Therefore, additional skew that may occur from data transmission through the data line CL may be eliminated. Consequently, the skew calibration block 130's margin of error of a skew calibration operation may be reduced.

Figure 6:
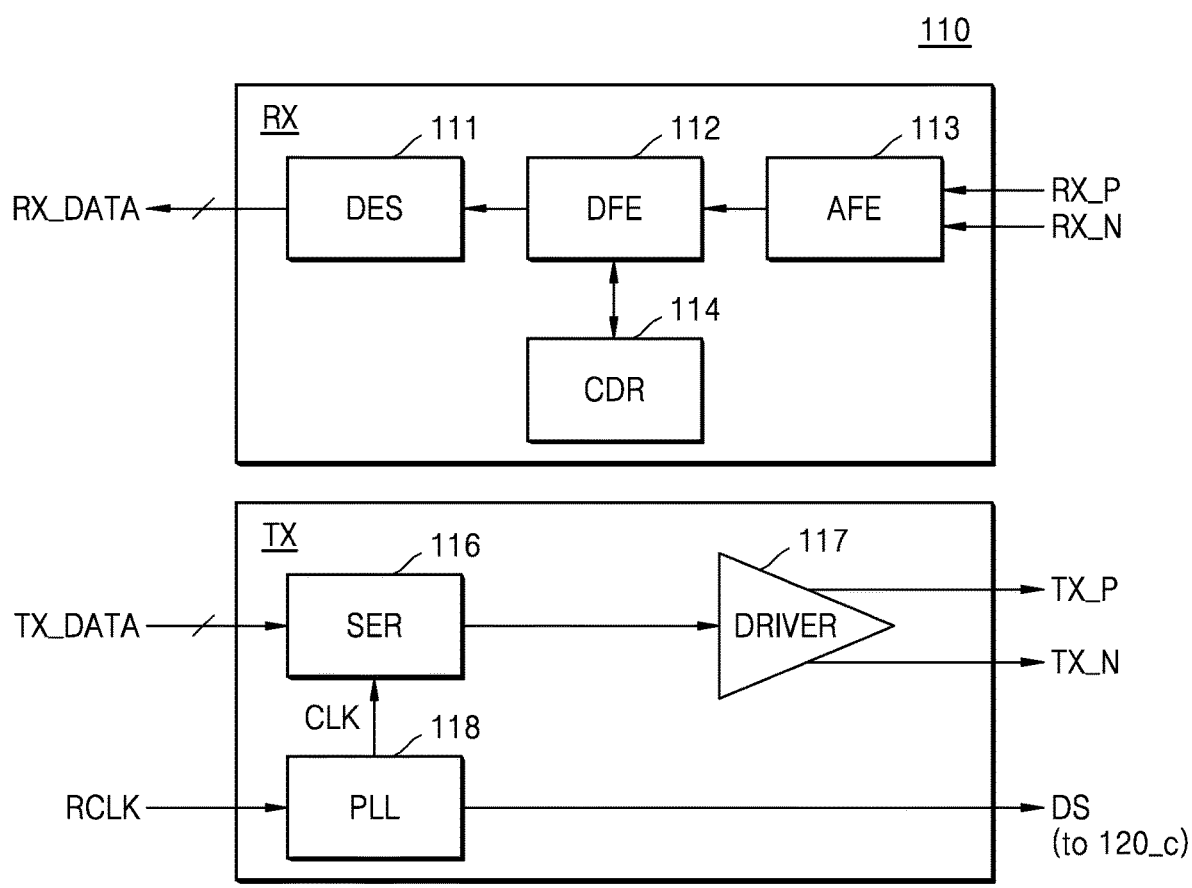
FIG. 6 is a block diagram of a SerDes circuit included in a test controller according to some example embodiments.

FIG. 6 shows a block diagram that describes a SerDes circuit included in a test controller according to some example embodiments.

Referring to FIG. 6, the SerDes circuit 110 may include a receiver RX and a transmitter TX.

The receiver RX may include an analog front end (AFE) circuit 113, a digital front end (DFE) circuit 112, a clock and data recovery (CDR) circuit 114 and a deserializer (DES) 111. The AFE circuit 113 may receive and convert analog signals RX_P and RX_N into digital signals that may be processed by an internal signal processing unit. The DFE circuit 112 may equalize the digital signals from the AFE circuit 113 using an equalization coefficient. The CDR circuit 114 may recover data and clock outputs from the DFE circuit 112. The DES 111 may receive the output from the DFE circuit 112 in a serial format and generate parallel received data RX DATA.

The transmitter TX includes a serializer (SER) 116, an output driver 117, and a phase locked loop (PLL) 118. The SER 116 may receive a parallel data transmission TX_DATA and a clock signal CLK, and convert the parallel data transmission TX_DATA and the clock signal CLK into a serial data transmission. The output driver 117 may receive the serial data transmission from the SER 116, and then amplify and output the serial data transmission as analog serial transmission signals TX_P and TX_N.

The PLL 118 may receive a reference clock signal RCLK then generate a clock signal CLK to be used by the transmitter TX. The PLL 118 may generate a strobe signal DS and transmit the strobe signal DS to a skew calibration input/output block (i.e. 120_c in FIG. 2). Here, the strobe signal DS may be identical to the clock signal CLK but is not limited thereto.

Although FIG. 6 illustrates and describes that the PLL 118 is included in the transmitter TX, the PLL 118 is not limited thereto and may be located outside the receiver RX and the transmitter TX that are included in the SerDes circuit 110 and may transmit the clock signal CLK to the receiver RX and the transmitter TX from the outside.

Figure 7:
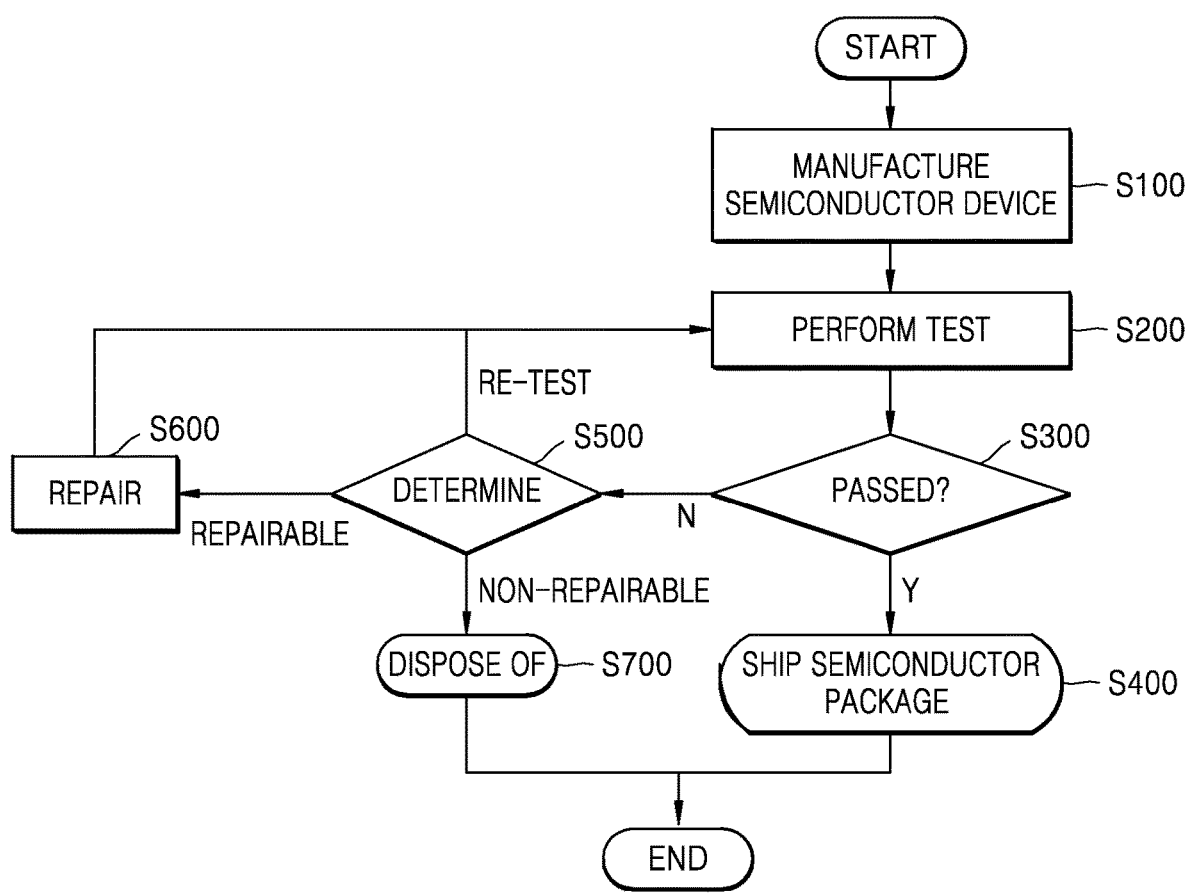
FIG. 7 is a flowchart illustrating a method of manufacturing a semiconductor device, according to some example embodiments.

FIG. 7 is a flowchart illustrating a method of manufacturing a semiconductor device, according to some example embodiments.

Referring to FIGS. 1, 2 and 7, a semiconductor device 20 is manufactured (S100). Specifically referring to a manufacturing process of the semiconductor device 20, a semiconductor substrate is first prepared to manufacture semiconductor devices that may include, for example, a system large scale integration (LSI), flash memory, dynamic random access memory (DRAM), static random access memory (SRAM), an electrically erasable programmable read-only memory (EEPROM), phase change random access memory (PRAM), magnetoresistive random access memory (MRAM), and/or resistive random access memory (RERAM). The semiconductor substrate may include, for example, silicon (Si). Additionally or alternatively, the semiconductor substrate may include semiconductor elements such as germanium (Ge), or compound semiconductors such as silicon carbide (SiC), gallium arsenide (GaAs), indium arsenide (InAs), and indium phosphide (InP). In addition, the semiconductor substrate may have a silicon on insulator (SOI) structure. For example, the semiconductor substrate may include buried oxide (BOX) layers.

Thereafter, a device isolation structure that defines conductive regions and active regions may be formed on the semiconductor substrate. The conductive region, for example, may include an impurity-doped well. The device isolation structure may be formed with various structures such as, a shallow trench isolation (STI) structure and/or a deep trench isolation (DTI) structure.

Thereafter, on the semiconductor substrate that has the active regions defined by the device isolation structure, the semiconductor device that includes a plurality of discrete devices of various kinds is formed. The plurality of discrete devices may include various microelectronic devices, for example, metal-oxide-semiconductor field effect transistors (MOSFET) like complementary metal-insulator-semiconductor (CMOS) transistors and the like, system large scale integrations (LSI), image sensors like CMOS imaging sensors (CIS) and the like, micro-electro-mechanical systems (MEMS), active devices, passive devices, and/or the like.

The plurality of discrete devices may be electrically connected to the conductive region. The semiconductor device may include at least two of the discrete devices, or more conductive wirings and conductive plugs that electrically connect the discrete devices to the conductive region. Moreover, each of the plurality of discrete devices may be electrically disconnected from other neighboring discrete devices by insulating layers. The semiconductor device may include various circuit elements in order to drive the plurality of discrete devices. Furthermore, the semiconductor device may include metal wiring, metal via, and intermetallic insulating film to electrically connect between the plurality of discrete devices and/or the circuit elements.

After the semiconductor substrate has a plurality of semiconductor devices formed thereon, individual semiconductor devices may be divided and packaged to form semiconductor devices 20.

According to some example embodiments, the semiconductor device 20 may include a plurality of semiconductor devices, such as semiconductor chip dies. In some example embodiments, the semiconductor device 20 may include a plurality of homogeneous semiconductor chip dies, while in other embodiments the semiconductor device 20 may include a plurality of heterogeneous semiconductor chip dies.

Thereafter, a test is performed on the manufactured semiconductor device 20 (S200). The test of the semiconductor device 20 may include, for example, a DC test, an AC test, or a functional test. To proceed with testing, the semiconductor device 20 may be electrically connected to the test apparatus 10.

In operation S200, first through nth data signals DATA1 through DATAn are sent by first through nth input/output blocks 120_1 through 120_n in a test controller 100 to test the semiconductor device 20. The test controller may be implemented with a FPGA.

The first through nth data signals DATA1 through DATAn sent from the first through nth input/output blocks 120_1 through 120_n may be received by a skew calibration input/output block 120_c. The skew calibration input/output block 120_c may receive a strobe signal DS generated by a SerDes circuit 110. Based on the strobe signal DS, the skew calibration input/output block 120_c may sample the first through nth data signals DATA1 through DATAn to generate first through nth data output signals ODATA1 through ODATAn. Using the strobe signal DS, which has a higher frequency than the first through nth data signals DATA1 through DATAn, a skew value between the first through nth data signals DATA1 through DATAn may be calculated, thus enabling skew calibration.

Therefore, according to the method of manufacturing the semiconductor device according to inventive concepts, by using the strobe signal DS from the SerDes circuit 110 included in the FPGA, operation S200 may be performed efficiently during testing of the semiconductor device because a separate integrated circuit is not required to calibrate the skew between the first through nth data signals DATA1 through DATAn.

After the test result is checked (S300), the semiconductor device 20 that passes the test (Y) may be shipped and supplied to the market (S400). On the other hand, after the test result is checked in operation S300, the semiconductor device 20 that fails to pass (N) may undergo a determination process (S500).

The semiconductor device 20 that failed to pass the test may be determined to be re-tested or repaired (S500). The determination may be made by analyzing the test result. For example, when a faulty test apparatus 10 is suspected or when the test result is unclear, a re-test may be conducted.

When the semiconductor device 20 is determined to be repairable, a repair may be performed (S600), after which the semiconductor device 20 is tested again. On the other hand, the semiconductor device 20 that is determined to be irreparable or fails to pass the re-test may be disposed of (S700). In some example embodiments, the semiconductor device 20 that has failed a re-test may be repaired (S600) to be re-tested again or re-tested again right away.

While inventive concepts have been particularly shown and described with reference to embodiments thereof, it will be understood that various changes in form and details may be made therein without departing from the spirit and scope of the following claims.

What is claimed is:

1. A test apparatus for a semiconductor device, the test apparatus comprising:
   a field programmable gate array (FPGA) configured to output a first data signal to be transmitted to the semiconductor device and a second data signal to be transmitted to the semiconductor device; and
   a memory configured to store a test result,
   wherein the FPGA includes,
      a first input/output block configured to output the first data signal,
      a second input/output block configured to output the second data signal,
      a serializer/deserializer (SerDes) circuit configured to generate a strobe signal, and
      a skew calibration input/output block configured to receive the first data signal from the first input/output block, the second data signal from the second input/output block, and the strobe signal from the SerDes circuit.

2. The test apparatus of claim 1, wherein the SerDes circuit is configured to output the strobe signal with a frequency greater than a frequency of the first data signal and a frequency of the second data signal.

3. The test apparatus of claim 1, further comprising:
   a first data line configured to transmit the first data signal from the first input/output block to the skew calibration input/output block; and
   a second data line configured to transmit the second data signal from the second input/output block to the skew calibration input/output block,
   wherein the FPGA is attached to a surface of a board substrate, and
   at least a portion of the first data line and the second data line is on the board substrate on the outside of the FPGA.

4. The test apparatus of claim 3, wherein a physical length of the first data line is equal to a physical length second data line.

5. The test apparatus of claim 1, further comprising:
   a skew calibration block configured to calibrate skew between the first data signal and the second data signal.

6. The test apparatus of claim 5, wherein the skew calibration input/output block comprises:
a first synchronous circuit; and
a second synchronous circuit,
the first synchronous circuit is configured to output a first data output signal based on the first data signal and in synchronism with the strobe signal,
the second synchronous circuit, is configured to output a second data output signal based on the second data signal and in synchronism with the strobe signal, and
the skew calibration block is configured to receive the first data output signal and the second data output signal and calculate skew between the first data signal and the second data signal.

7. The test apparatus of claim 1, wherein the SerDes circuit comprises a phased locked loop (PLL) circuit, and
the PLL circuit is configured to generate the strobe signal and transmit the strobe signal to the skew calibration input/output block.

8. The test apparatus of claim 1, wherein the semiconductor device includes a memory device.

9. The test apparatus of claim 1, wherein the semiconductor device includes a system large scale integration (LSI) device.

10. A test apparatus for a semiconductor device, the test apparatus comprising:
a test controller configured to output a first data signal to be transmitted to the semiconductor device and a second data signal to be transmitted to the semiconductor device; and
a memory configured to store test results,
wherein the test controller includes,
a first input/output block configured to output a first data signal,
a second input/output block configured to output a second data signal,
a serializer/deserializer (SerDes) circuit configured to generate a strobe signal, and
a skew calibration input/output block configured to receive the first data signal, the second data signal, and the strobe signal,
wherein a frequency of the strobe signal is greater than a frequency of the first data signal and a frequency of the second data signal.

11. The test apparatus of claim 10, further comprising:
a first data line configured to electrically connect the first input/output block to the skew calibration input/output block to transmit the first data signal; and
a second data line configured to electrically connect the second input/output block to the skew calibration input/output block to transmit the second data signal.

12. The test apparatus of claim 11, wherein at least a portion of the first data line and the second data line are outside of the test controller.

13. The test apparatus of claim 11, wherein a physical length of the first data line is equal to a physical length of the second data line.

14. The test apparatus of claim 10, further comprising:
a skew calibration block configured to calibrate skew between the first data signal and the second data signal.

15. The test apparatus of claim 14, wherein the skew calibration input/output block comprises a first synchronous circuit and a second synchronous circuit,
the first synchronous circuit is configured to output a first data output signal based on the first data signal and in synchronism with the strobe signal,
the second synchronous circuit is configured to output a second data output signal based on the second data signal and in synchronism with the strobe signal, and
the skew calibration block is configured to receive the first data output signal and the second data output signal and calculate skew between the first data signal and the second data signal.

16. The test apparatus of claim 15, wherein the strobe signal from the SerDes circuit is configured to reach the first synchronous circuit and the second synchronous circuit at the same time.

17. The test apparatus of claim 10, wherein the test controller includes a field programmable gate array (FPGA).

18. A method of manufacturing a semiconductor device using a test apparatus that includes a field programmable gate array (FPGA), the method comprising:
manufacturing the semiconductor device; and
testing the semiconductor device,
wherein the testing includes,
outputting a first data signal and a second data signal to test the semiconductor device, the outputting a first data signal and a second data signal performed by a first input/output block and a second input/output block included in the FPGA,
receiving the first data signal and the second data signal, the receiving the first data signal and the second data signal performed by a skew calibration input/output block included in the FPGA,
receiving a strobe signal that is generated by a serializer/deserializer (SerDes) circuit, the receiving the strobe signal performed by a skew calibration input/output block, and
sampling the first data signal and the second data signal based on the strobe signal, the sampling performed by the skew calibration input/output block.

19. The method of claim 18, wherein operating speeds of each of the first input/output block and the second input/output block are slower than an operating speed of the SerDes circuit.

20. The method of claim 18, wherein the testing of the semiconductor device further comprises:
calculating skew between the first data signal and the second data signal, based on the first data signal and the second data signal sampled from the skew calibration input/output block.

* * * * *